United States Patent
Tu et al.

(10) Patent No.: US 8,659,121 B2
(45) Date of Patent: Feb. 25, 2014

(54) SEMICONDUCTOR DEVICES WITH ORIENTATION-FREE DECOUPLING CAPACITORS AND METHODS OF MANUFACTURE THEREOF

(75) Inventors: Kuo-Chi Tu, Hsin-Chu (TW); Kuo-Chyuan Tzeng, Chu-Pei (TW); Wen-Chuan Chiang, Hsin-Chu (TW); Chen-Jong Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 118 days.

(21) Appl. No.: 13/188,343

(22) Filed: Jul. 21, 2011

(65) Prior Publication Data

US 2013/0020678 A1 Jan. 24, 2013

(51) Int. Cl.
*H01L 23/62* (2006.01)

(52) U.S. Cl.
USPC ............. 257/532; 257/E27.016; 257/E29.343

(58) Field of Classification Search
USPC ........................... 257/532, E27.016, E29.343
See application file for complete search history.

(56) References Cited

U.S. PATENT DOCUMENTS

| | | | |
|---|---|---|---|
| 6,677,637 B2 | 1/2004 | Ning et al. | |
| 6,737,728 B1 | 5/2004 | Block et al. | |
| 6,781,185 B2 | 8/2004 | Chen et al. | |
| 6,803,641 B2 * | 10/2004 | Papa Rao et al. | 257/532 |
| 6,936,881 B2 | 8/2005 | Yeo et al. | |
| 6,937,457 B2 | 8/2005 | Shih et al. | |
| 6,940,705 B2 * | 9/2005 | Yeo et al. | 361/302 |
| 7,195,970 B2 | 3/2007 | Tu et al. | |
| 7,557,399 B2 | 7/2009 | Tu et al. | |
| 7,893,481 B2 * | 2/2011 | List et al. | 257/306 |
| 2004/0073881 A1 * | 4/2004 | Nassif et al. | 716/10 |
| 2004/0184202 A1 * | 9/2004 | Togashi et al. | 361/15 |
| 2007/0230087 A1 * | 10/2007 | Komaki | 361/306.2 |
| 2008/0122032 A1 | 5/2008 | Tu et al. | |
| 2009/0002921 A1 * | 1/2009 | Ritter et al. | 361/321.3 |
| 2010/0065944 A1 | 3/2010 | Tu et al. | |
| 2010/0224925 A1 | 9/2010 | Ching et al. | |
| 2011/0057685 A1 * | 3/2011 | Noguchi | 326/103 |
| 2013/0001664 A1 * | 1/2013 | Khor | 257/300 |
| 2013/0020678 A1 * | 1/2013 | Tu et al. | 257/532 |

OTHER PUBLICATIONS

Wikipedia, "Decoupling capacitor," http://en.wikipedia.org/wiki/Decoupling_capacitor, Jul. 20, 2011, pp. 1-4.
NEC Electronics America, Inc., "New ASIC Process Technology Makes Embedded DRAM Practical Choice for High-Performance Applications," Feb. 2003, pp. 1-10.

* cited by examiner

*Primary Examiner* — George Fourson, III
(74) *Attorney, Agent, or Firm* — Slater & Matsil, L.L.P.

(57) ABSTRACT

Semiconductor devices with orientation-free decoupling capacitors and methods of manufacture thereof are disclosed. In one embodiment, a semiconductor device includes at least one integrated circuit and at least one decoupling capacitor. The at least one decoupling capacitor is oriented in a different direction than the at least one integrated circuit is oriented.

10 Claims, 3 Drawing Sheets

US 8,659,121 B2

SEMICONDUCTOR DEVICES WITH ORIENTATION-FREE DECOUPLING CAPACITORS AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

In some semiconductor devices, power lines and ground lines are routed to logic gates and other devices in integrated circuits. The current from a power supply flows through the power lines, logic gates, and finally to ground. During the switching of the logic gates, a large amount of change in the current occurs within a short period of time. Decoupling capacitors are used to absorb these glitches during current switching. Decoupling capacitors are also used to maintain a constant voltage between the supply voltage and ground. The decoupling capacitors act as charge reservoirs that additionally supply current to circuits when required to prevent momentary drops in the supplied voltage.

One type of decoupling capacitor used is referred to as a metal-insulator-metal (MIM) capacitor. A MIM capacitor has two metal layers and a dielectric insulator layer between the two metal layers. A capacitance is formed between the two metal layers. MIM capacitors are often fabricated in upper interconnect layers of a semiconductor device.

What are needed in the art are improved decoupling MIM capacitor designs.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1:
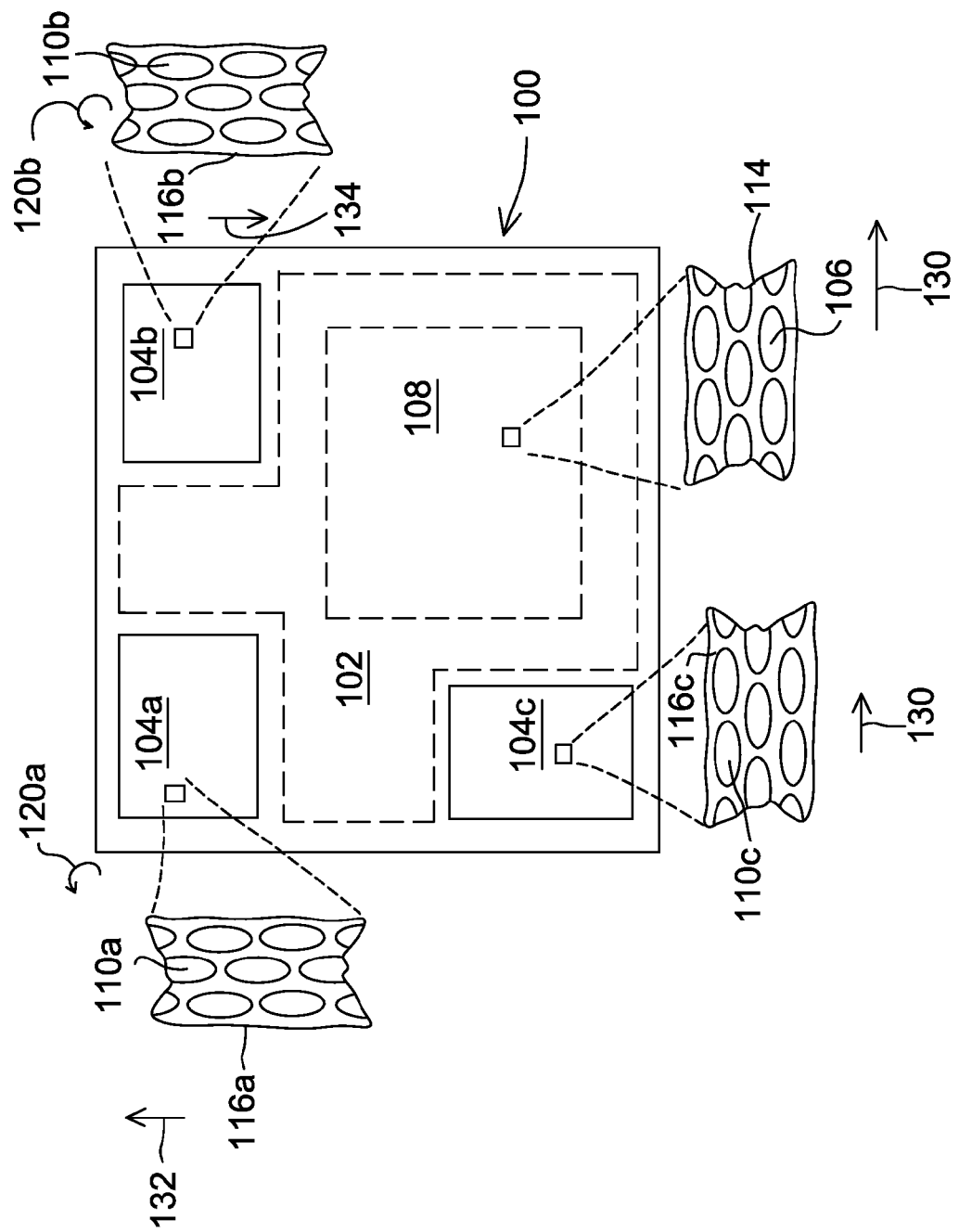
FIG. 1 shows a top view of a semiconductor device in accordance with an embodiment of the present disclosure, wherein a plurality of decoupling MIM capacitors are positioned in different directions than integrated circuits of the semiconductor device are positioned.

Embodiments of the present disclosure are related to novel designs for decoupling capacitors of semiconductor devices, in particular, decoupling MIM capacitors. Referring first to FIG. 1, a top view of a semiconductor device 100 is shown in accordance with an embodiment of the present disclosure. A plurality of decoupling MIM capacitors 110a and 110b are positioned in different directions 132 and 134, respectively, than the direction 130 that integrated circuits 106 of the semiconductor device 100 are positioned. The orientation direction of the integrated circuits 106 and MIM capacitors 110a and 110b is determinable by the physical shape, for example.

The semiconductor device 100 includes an integrated circuit region 102 wherein a plurality of integrated circuits 106 is formed. Some portions of the integrated circuit region 102 may comprise an array 108 of integrated circuits 106, for example, as shown in the more detailed view at 114. The integrated circuits 106 may comprise one or more microprocessors, logic circuits, memory circuits, and/or transistors, as examples, although alternatively, the integrated circuits 106 may comprise other types of devices and electrical components. The integrated circuits 106 may comprise one or more blocks of arrays 108 of integrated circuits 106 comprising different types of integrated circuits 106 in some embodiments.

The semiconductor device 100 includes one or more decoupling MIM capacitor regions 104a, 104b, and 104c, as shown. Decoupling MIM capacitors 110a and 110b in decoupling MIM capacitor regions 104a and 104b, respectively, are oriented in different direction 132 and 134 than direction 130 that integrated circuits 106 in integrated circuit region 102 are oriented in, as shown in the more detailed views at 116a and 116b, respectively.

Figure 2:
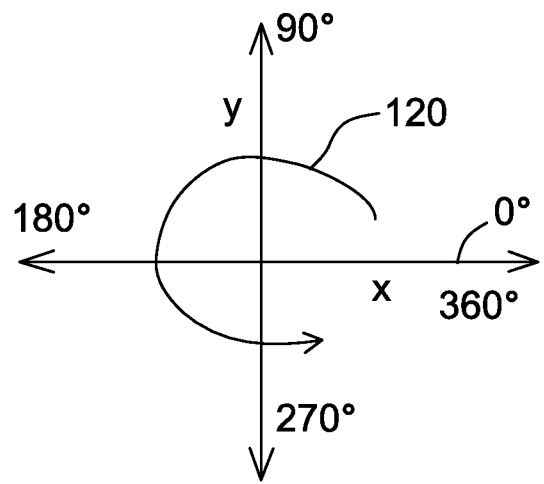
FIG. 2 illustrates angles that a decoupling MIM capacitor may be oriented in, in accordance with an embodiment.

In the example shown, integrated circuits 106 are oriented in a first direction 130, and decoupling MIM capacitors 110a in decoupling MIM capacitor region 104a are oriented in a direction 132 that is rotated by an angle 120a of about 90 degrees from direction 130. Decoupling MIM capacitors 110b in decoupling MIM capacitor region 104b are oriented in a direction 134 that is rotated by an angle 120b of about 270 degrees from direction 130. These rotational orientations are examples; alternatively, the directions 132 and 134 that the decoupling MIM capacitors 110a and 110b may be oriented may comprise any angle 120a or 120b of rotation other than 0 degrees in some embodiments. For example, direction 130 that the integrated circuits 106 are oriented in may comprise about 0 degrees, and directions 132 and 134 may range from greater than about 0 degrees to less than about 360 degrees. Some decoupling MIM capacitors 110c in decoupling MIM capacitor region 116c may be oriented in the same direction 130 that the integrated circuits 106 are oriented in, for example. Advantageously, the orientation of the various regions 104a, 104b, and 104c of the decoupling MIM capacitors 110a, 110b, and 110c, respectively, may be selected to optimize the performance of the semiconductor device 100 and achieve the most space-efficient layout. FIG. 2 illustrates an angle 120 that a decoupling MIM capacitor 110a, 110b, or 110c (not shown in FIG. 2: see FIG. 1) may be oriented in, in accordance with an embodiment.

Figure 3:
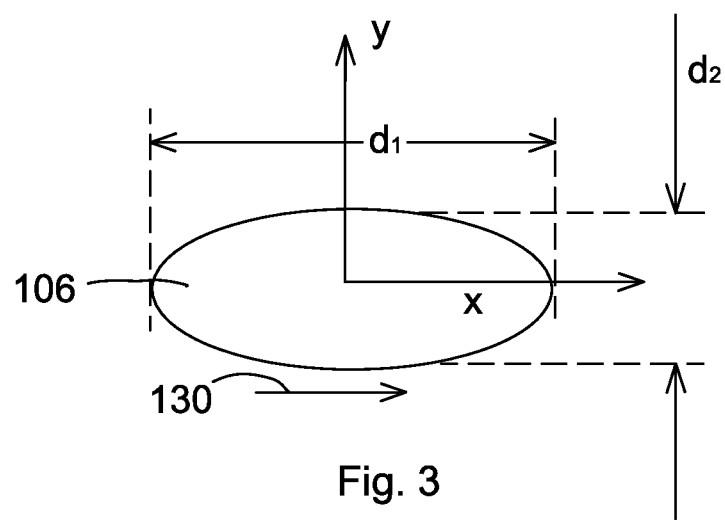
FIG. 3 illustrates an orientation of an integrated circuit of the semiconductor device.

FIG. 3 illustrates an orientation of an integrated circuit 106 of the semiconductor device 100. The integrated circuits 106 may comprise a portion having a semiconductive or conductive material comprising an oval shape in a top view, as shown, having an elongated side comprising dimension $d_1$ and a shorter side comprising dimension $d_2$. The elongated sides comprising dimension $d_1$ of the integrated circuit 106 are aligned substantially along the x axis, e.g., in a direction 130 comprising about 0 degrees with respect to the x axis in a top view of the semiconductor device 100. In one embodiment, the orientation of an integrated circuit is determined as the direction perpendicular to the gate length of the transistors in the integrated circuit.

Figure 4:
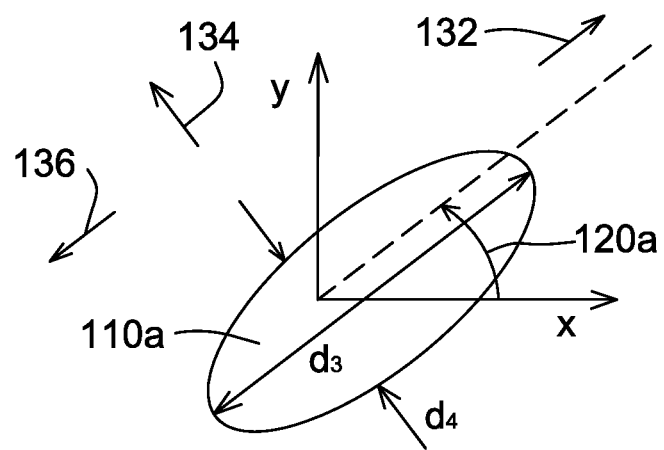
FIG. 4 illustrates an orientation of a decoupling MIM capacitor in accordance with an embodiment.

FIG. 4 illustrates an orientation of a decoupling MIM capacitor 110a (or 110b, not shown) in accordance with an embodiment. The decoupling MIM capacitor 110a may comprise a portion comprising a conductive material having an oval shape in a top view of the semiconductor device 100, as shown, having an elongated side comprising dimension $d_3$ and a shorter side comprising dimension $d_4$. The elongated sides comprising dimension $d_3$ of the decoupling MIM capacitor 110a are aligned substantially along direction 132 which in the embodiment shown comprises an angle 120a of about 45 degrees with respect to the x axis. Alternatively, in accordance with embodiments of the present disclosure, angle 120a may comprise other angles to achieve other directions 134 and 136, which are shown as additional examples of possible orientations for the decoupling MIM capacitors 110a.

Referring again to FIG. 1, the shape of the decoupling MIM capacitors 110a, 110b, and 110c may alternatively comprise other shapes than the oval shape shown. For example, the decoupling MIM capacitors 110a, 110b, and 110c may comprise the shape of a cylinder, cup, trench, bar, or finger in a perspective view (not shown). The decoupling MIM capacitors 110a, 110b, and 110c may comprise the shape of a rectangle, square, circle, or oval in a top view of the semiconductor device, as examples. Alternatively, the decoupling MIM capacitors 110a, 110b, and 110c of the present embodiments may comprise other shapes.

Figure 5:
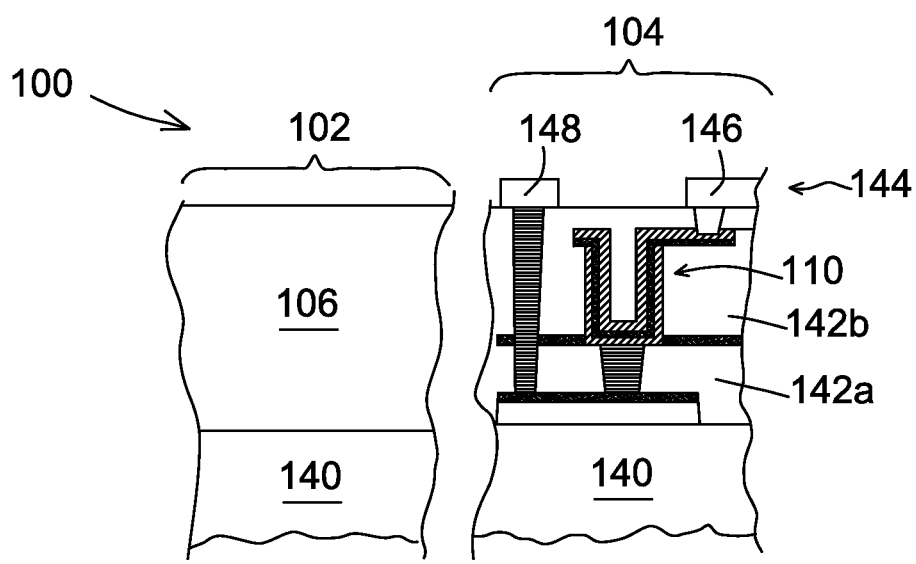
FIG. 5 shows a cross-sectional view of a decoupling MIM capacitor formed in a semiconductor device in accordance with an embodiment.

Embodiments of the present disclosure include semiconductor devices 100 that include the orientation-free decoupling MIM capacitors 104a, 104b, and 104c described herein and also include methods of manufacturing thereof. FIG. 5 shows a cross-sectional view of a decoupling MIM capacitor 110 in accordance with an embodiment. To manufacture the semiconductor device 100, a workpiece 140 is provided. The workpiece 140 may include a semiconductor substrate comprising silicon or other semiconductor materials and may be covered by an insulating layer, for example. The workpiece 140 may also include other active components or circuits, not shown. The workpiece 140 may comprise silicon oxide over single-crystal silicon, for example. The workpiece 140 may include other conductive layers or other semiconductor elements, e.g., transistors, diodes, etc. Compound semiconductors, GaAs, InP, Si/Ge, or SiC, as examples, may be used in place of silicon. The workpiece 140 may comprise a silicon-on-insulator (SOI) or a germanium-on-insulator (GOI) substrate, as examples. The workpiece 140 may comprise one or more layers of electrical circuitry and/or electronic functions formed thereon, and may include conductive lines, vias, capacitors, diodes, transistors, resistors, inductors, and/or other electrical components, for example (not shown).

A method of manufacturing the semiconductor device 100 includes forming at least one integrated circuit 106 over the workpiece 140, e.g., in integrated circuit region 102, and forming at least one decoupling MIM capacitor 110 over the workpiece 140, e.g., in decoupling MIM capacitor region 104. The semiconductor device 100 includes at least one power supply line 144. One or more of the decoupling MIM capacitors 110 may be coupled between a voltage source line 146 and a voltage return line 148 of the power supply line 144, as shown. In some embodiments, voltage return line 148 comprises a ground node. In some embodiments, at least two of the plurality of decoupling MIM capacitors 110, 110a, 110b, and 110c may be coupled in series between a pair of supply nodes (i.e., voltage source line 146 and voltage return line 148) of the semiconductor device 100, as described in copending, commonly assigned U.S. patent application Ser. No. 12/212,096, entitled "Semiconductor Device with Decoupling Capacitor Design" filed on Sep. 17, 2008 and published as U.S. Publication No. US 2010/0065944 A1 on Mar. 18, 2010, which is hereby incorporated by reference herein. Two decoupling MIM capacitors 110, 110a, 110b, and 110c may be coupled in series to divide the power supply voltage into half, for example, and thus reducing voltage stress on the capacitors 110, 110a, 110b, and 110c. In other embodiments, at least two decoupling MIM capacitors 110, 110a, 110b, and 110c are coupled in series between a pair of supply nodes of the semiconductor device 100, as another example.

In some embodiments, forming the integrated circuits 106 comprises forming a gate and a gate dielectric of at least one transistor. In other embodiments, forming the decoupling MIM capacitors 110, 110a, 110b, and 110c comprises forming at least a portion of at least one decoupling MIM capacitor 110, 110a, 110b, and 110c in at least one metallization layer of the semiconductor device 100. The MIM capacitors 110, 110a, 110b, and 110c may be formed within insulating material layers 142a and 142b of the semiconductor device 100, as shown in FIG. 5. In other embodiments, forming the integrated circuits 106 and forming the decoupling MIM capacitors 110, 110a, 110b, and 110c may comprise simultaneously forming the integrated circuits 106 and the decoupling MIM capacitors 110, 110a, 110b, and 110c, for example.

An optimal location for the novel decoupling MIM capacitors 110, 110a, 110b, and 110c may be determined to minimize a stress voltage of the decoupling MIM capacitor 110, 110a, 110b, and 110c, before forming the decoupling MIM capacitors 110, 110a, 110b, and 110c, for example. An optimal location for the decoupling MIM capacitors 110, 110a, 110b, and 110c may also be determined, in order to reduce an area required for the integrated circuits 106 and the decoupling MIM capacitors 110, 110a, 110b, and 110c on the semiconductor device 100.

Advantages of embodiments of the disclosure include providing orientation-free methods of forming and fabricating decoupling MIM capacitors 110, 110a, 110b, and 110c that allow a large amount of layout and arrangement flexibility in the semiconductor device 100 designs. Chip area is reduced by the use of the optimized decoupling MIM capacitor 110, 110a, 110b, and 110c blocks (e.g., decoupling MIM capacitor regions 104a, 104b, and 104c shown in FIG. 1), in which the layout of the decoupling MIM capacitors 110, 110a, 110b, and 110c is orientation-free. The novel design methods and semiconductor device 100 structures are easily implemented in manufacturing and packaging process flows.

In accordance with one embodiment of the present disclosure, a semiconductor device includes at least one integrated circuit and at least one decoupling capacitor, wherein the at least one decoupling capacitor is oriented in a different direction than the at least one integrated circuit is oriented.

In accordance with another embodiment, a semiconductor device includes a workpiece and a plurality of integrated circuits disposed over the workpiece, the plurality of integrated circuits being oriented in a first direction. A plurality of metallization layers is disposed over the plurality of integrated circuits. A plurality of decoupling capacitors is disposed within the plurality of metallization layers, the plurality of decoupling capacitors being oriented in at least one second direction. The at least one second direction is different than the first direction.

In accordance with yet another embodiment, a method of manufacturing a semiconductor device includes providing a workpiece and forming at least one integrated circuit over the workpiece. The method includes forming at least one decoupling capacitor over the workpiece. The at least one decoupling capacitor is oriented in a different direction than the at least one integrated circuit is oriented.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate comprising a major surface;
   a voltage source line;
   a voltage return line;
   at least one integrated circuit comprising a transistor having a gate width direction parallel to the major surface of the substrate; and
   at least one decoupling capacitor connected between the voltage source line and the voltage return line, wherein the at least one decoupling capacitor has a longer side and a shorter side shorter than the longer side in a top view of the semiconductor device, wherein the longer side extends in a longitudinal direction parallel to the major surface of the substrate, and wherein the gate width direction of the transistor and the longitudinal direction form an angle of about 45 degrees.

2. The semiconductor device according to claim 1, wherein the at least one decoupling capacitor includes two decoupling capacitors connected in series between the voltage source line and the voltage return line.

3. The semiconductor device according to claim 1, wherein the at least one integrated circuit comprises a microprocessor, a logic circuit, a memory circuit, and/or a transistor.

4. The semiconductor device according to claim 1, wherein the at least one decoupling capacitor comprises a plurality of decoupling capacitors connected in parallel.

5. A semiconductor device, comprising:
   a substrate;
   a voltage supply line;
   a voltage return line;
   a plurality of integrated circuits disposed over the substrate, the plurality of integrated circuits comprising a plurality of transistors, with gate width directions of the plurality of transistors being oriented in a first direction;
   a plurality of metallization layers disposed over the plurality of integrated circuits; and
   a plurality of decoupling capacitors connected between the voltage supply line and the voltage return line, and disposed within the plurality of metallization layers, the plurality of decoupling capacitors having longitudinal directions being oriented in at least one second direction, wherein the at least one second direction is different than the first direction.

6. The semiconductor device according to claim 5, wherein the plurality of decoupling capacitors comprises a first group of decoupling metal-insulator-metal (MIM) capacitors and a second group of decoupling MIM capacitors, the first group of decoupling MIM capacitors having longitudinal directions being oriented in a different direction than longitudinal directions of the second group of decoupling MIM capacitors.

7. The semiconductor device according to claim 6, wherein the plurality of decoupling capacitors further comprises at least one third group of decoupling capacitors, each at least one third group of decoupling capacitors having longitudinal directions being oriented in a different direction than the first group of decoupling capacitors and the second group of decoupling capacitors.

8. The semiconductor device according to claim 5, wherein at least one of the plurality of decoupling capacitors is disposed proximate at least one of the plurality of integrated circuits.

9. The semiconductor device according to claim 5, wherein at least two of the plurality of decoupling MIM capacitors are coupled in series between a pair of supply nodes of the semiconductor device.

10. The semiconductor device according to claim 5, wherein the plurality of decoupling capacitors comprises a plurality of first decoupling capacitors, further comprising a plurality of second decoupling capacitors disposed within the plurality of metallization layers, the plurality of second decoupling capacitors having longitudinal directions being oriented in the first direction.

* * * * *